(12) United States Patent
Takano et al.

(10) Patent No.: US 11,616,527 B2
(45) Date of Patent: Mar. 28, 2023

(54) TRANSMITTER/RECEIVER AND SIGNAL GENERATION METHOD

(71) Applicant: HIROSHIMA UNIVERSITY, Hiroshima (JP)

(72) Inventors: Kyoya Takano, Hiroshima (JP); Minoru Fujishima, Hiroshima (JP)

(73) Assignee: HIROSHIMA UNIVERSITY, Hiroshima (JP)

( * ) Notice: Subject to any disclaimer, the term of this patent is extended or adjusted under 35 U.S.C. 154(b) by 146 days.

(21) Appl. No.: 17/295,343

(22) PCT Filed: Nov. 18, 2019

(86) PCT No.: PCT/JP2019/045149
§ 371 (c)(1),
(2) Date: May 19, 2021

(87) PCT Pub. No.: WO2020/110814
PCT Pub. Date: Jun. 4, 2020

(65) Prior Publication Data
US 2022/0021411 A1    Jan. 20, 2022

(30) Foreign Application Priority Data

Nov. 28, 2018  (JP) .............................. JP2018-221804

(51) Int. Cl.
*H04B 1/38* (2015.01)
*H04B 1/54* (2006.01)
(Continued)

(52) U.S. Cl.
CPC ............. *H04B 1/54* (2013.01); *H03D 7/1483* (2013.01); *H03D 7/163* (2013.01)

(58) Field of Classification Search
CPC ...... H04B 1/54; H04B 1/0071; H04B 1/0075; H04B 1/0082; H04B 1/38; H04B 1/40; H03D 7/1483; H03D 7/163
See application file for complete search history.

(56) References Cited

U.S. PATENT DOCUMENTS 10,404,305 B2 *  9/2019  Lee ...................... H03D 7/1458
2010/0093299 A1  4/2010  Pinel et al.
(Continued)

FOREIGN PATENT DOCUMENTS

JP     2018-125712 A     8/2018

OTHER PUBLICATIONS

International Search Report (ISR) dated Dec. 17, 2019 filed in PCT/JP2019/045149.
(Continued)

*Primary Examiner* — Tuan Pham
(74) *Attorney, Agent, or Firm* — Rankin, Hill & Clark LLP

(57) ABSTRACT

A transmitter/receiver (1) up-converts, using an LO signal as a local oscillation signal, an IF signal having a predetermined frequency band, thereby generating a transmission signal $RF_{TX}$. Moreover, the transmitter/receiver (1) generates a $(LO+IF)^2$ signal and a $(LO-IF)^2$ signal based on the IF signal and the LO signal. Using the LO signal obtained by adding-up of the $(LO+IF)^2$ signal and the $(LO-IF)^2$ signal, a reception signal $RF_{RX}$ is down-converted. Thus, a local oscillation signal generation unit of a receiving unit is not necessary.

5 Claims, 3 Drawing Sheets

(51) Int. Cl.
　　　*H03D 7/14*　　　(2006.01)
　　　*H03D 7/16*　　　(2006.01)

(56) References Cited

U.S. PATENT DOCUMENTS

2014/0162573 A1* 6/2014 Laskar .............. H04W 52/0209
　　　　　　　　　　　　　　　　　　　　　　　　327/156
2018/0294832 A1* 10/2018 Chi ........................ H03L 7/099

OTHER PUBLICATIONS

Takano et al., "A 105Gb/s 300GHz CMOS Transmitter", Digest of Technical Papers IEEE International Solid-State Circuits Conference, 2017, pp. 308-309; Cited in Specification.

Hara et al., "A 32Gbits/s 16QAM CMOS Receiver in 300GHz Band", IEEE MTT-S International Microwave Symposium, 2017, pp. 1703-1706; Cited in Specification.

Lee et al., "An 80-GB/s 300-GHz-Band Single-Chip CMOS Transceiver", IEEE Journal of Solid-State Circuits, 2019, vol. 54, issue 12, IEEE, pp. 3577-3588, in particular, section I-III; Cited in ISR.

Fujishima, "Key Technologies for THz Wireless Link by Silicon CMOS Integrated Circuits", Photonics, Multidisciplinary Digital Publishing Institute, 2018, 5, 50, total 17 pages; Cited in ISR.

Fujishima, "Silicon CMOS Integrated Circuit for 300-GHz-Band Wireless Communication", IEICE General Conference (Electronics 1), 2018, pp. SS39-SS40; English translation, Cited in ISR.

\* cited by examiner

TRANSMITTER/RECEIVER AND SIGNAL GENERATION METHOD

TECHNICAL FIELD

The present invention relates to a transmitter/receiver and a signal generation method.

BACKGROUND ART

In the case of performing wireless communication by means of a high-frequency signal, specifically in the case of performing wireless communication by means of a higher-frequency carrier wave than the maximum operating frequency of a transistor used for, e.g., a signal amplification circuit of a transmitter/receiver, the carrier wave cannot be amplified by a power amplifier. A transmitter configured to perform wireless communication with such a high frequency has been developed (e.g., Patent Literature 1, Nonpatent Literature 1).

The transmitter of Patent Literature 1 and Nonpatent Literature 1 has a parallel configuration at the final stage of the transmitter, and combines multiple output signals of parallel configuration portions by a power combiner to generate a carrier wave without amplification with a high frequency by a power amplifier.

In a receiver configured to receive a high-frequency signal as described above, a local oscillator is, as in the above-described transmitter, used to generate a local oscillator signal to be input to a down conversion mixer (e.g., Nonpatent Literature 2).

CITATION LIST

Patent Literature

PATENT LITERATURE 1: JP-A-2018-125712

Nonpatent Literature

NONPATENT LITERATURE 1: K. Takano, et al., "A 105 Gb/s 300 GHz CMOS Transmitter," Digest of Technical Papers IEEE International Solid-State Circuits Conference, p. 308-309, February 2017

NONPATENT LITERATURE 2: S. Hara, et al., "A 32 Gbits/s 16QAM CMOS Receiver in 300 GHz Band," 2017 IEEE MTT-S International Microwave Symposium, p. 1703-1706, June 2017

SUMMARY OF THE INVENTION

Problems to be Solved by the Invention

In a transmitter/receiver of Nonpatent Literature 2, each of a transmitter and a receiver has a local oscillator, and therefore, the power consumption of the entirety of the transmitter/receiver is high and a circuit area is large.

The present invention has been made in view of the above-described situation, and is intended to provide a transmitter/receiver with a lower power consumption and a smaller circuit area.

Solution to the Problems

For accomplishing the above-described object, a transmitter/receiver according to a first aspect of the present invention includes a local oscillator configured to up-convert an input signal having a predetermined frequency band to output a local oscillation signal for generating a transmission signal, a first adding unit configured to output a signal obtained by adding up of the input signal and the local oscillation signal, a first multiplication unit configured to multiply the output signal of the first adding unit, a second adding unit configured to output a signal obtained by adding up of an inverted-phase signal of the input signal and the local oscillation signal, a second multiplication unit configured to multiply the output signal of the second adding unit, an adding/subtraction unit configured to output an addition signal and a subtraction signal generated by adding-up and subtraction of the signal multiplied by the first multiplication unit and the signal multiplied by the second multiplication unit, and a down conversion mixer configured to down-convert a reception signal received by a receiving antenna by means of the addition signal generated by the adding/subtraction unit.

Each of the first multiplication unit and the second multiplication unit may include a squaring circuit configured to square a signal input thereto.

The input signal may be an intermediate frequency signal obtained by mixing of a baseband signal and the local oscillation signal.

The transmitter/receiver may include a frequency filter configured to allow passage of a signal with a predetermined frequency in the addition signal, and full duplex communication may be performed.

A signal generation method according to a second aspect of the present invention includes the first adding step of adding a local oscillation signal to an input signal having a predetermined frequency band, the first multiplication step of multiplying the signal obtained by addition at the first adding step, the second adding step of adding the local oscillation signal to an inverted-phase signal of the input signal, the second multiplication step of multiplying the signal obtained by addition at the second adding step, the addition/subtraction step of subtracting the signal multiplied at the second multiplication step from the signal multiplied at the first multiplication step to generate a subtraction signal and adding up the signal multiplied at the first multiplication step and the signal multiplied at the second multiplication step to generate an addition signal, and the down conversion step of down-converting a reception signal received by a receiving antenna by means of the addition signal.

Effects of the Invention

According to the transmitter/receiver of the present invention, the local oscillation signal generated upon generation of the transmission signal is utilized as the local oscillation signal of the down conversion mixer of a receiving unit. Thus, a local oscillator of the receiving unit can be omitted, and therefore, the power consumption of the transmitter/receiver can be reduced and the circuit area can be decreased.

DESCRIPTION OF THE EMBODIMENTS

Hereinafter, a transmitter/receiver according to an embodiment of the present invention will be described with reference to the drawings.

Figure 1:
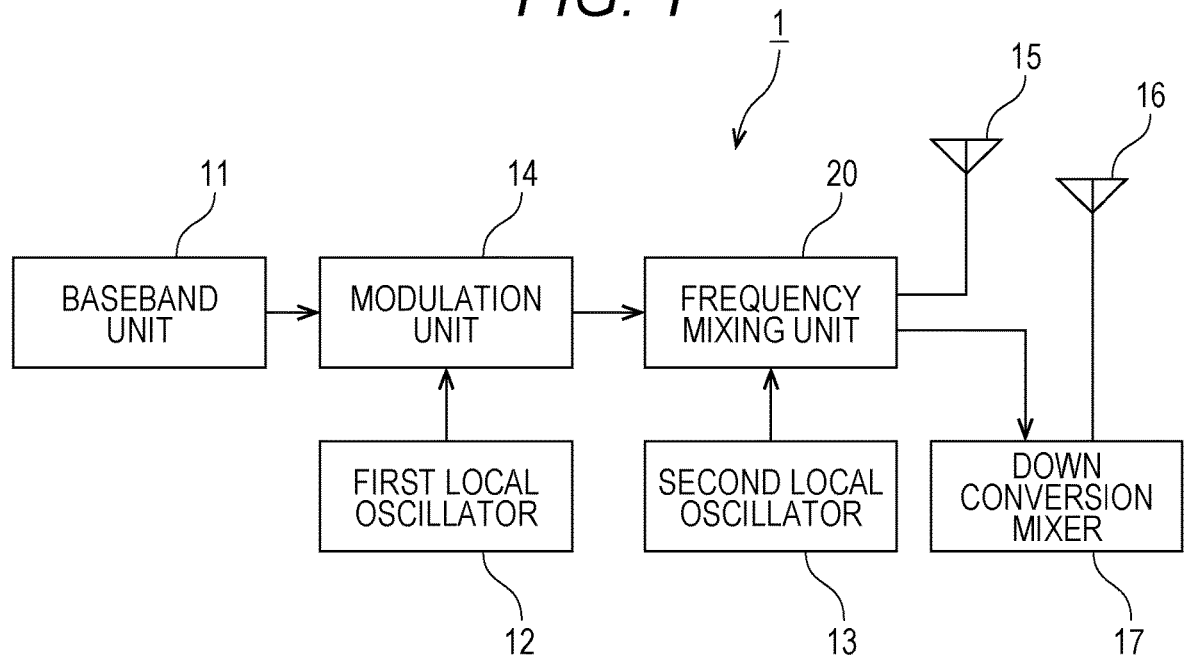
FIG. 1 is a block diagram of a transmitter/receiver according to an embodiment of the present invention.

As shown in a block diagram of FIG. 1, a transmitter/receiver 1 according to the present embodiment is a wireless transmitter/receiver including a baseband unit 11, a first local oscillator 12, a second local oscillator 13, a modulation unit 14, a frequency mixing unit 20, a transmission antenna 15, a receiving antenna 16, and a down conversion mixer 17.

The baseband unit 11 outputs, as a baseband signal, information transmitted from the transmitter/receiver 1 to the modulation unit 14.

The first local oscillator 12 generates a first local oscillation signal for generating an intermediate frequency signal (hereinafter referred to as an IF signal) having a predetermined frequency band from the baseband signal. The first local oscillator 12 outputs the first local oscillation signal to the modulation unit 14.

The second local oscillator 13 generates a second local oscillation signal (hereinafter referred to as a LO signal) used as a carrier wave. The second local oscillator 13 outputs the LO signal to the frequency mixing unit 20.

The modulation unit 14 includes a mixer configured to mix the baseband signal as the output signal of the baseband unit 11 and the first local oscillation signal as the output signal of the first local oscillator 12 to generate the IF signal. The modulation unit 14 outputs the IF signal to the frequency mixing unit 20.

Using the IF signal generated by the modulation unit 14 as an input signal, the frequency mixing unit 20 up-converts the IF signal to generate a transmission signal (hereinafter referred to as an $RF_{TX}$ signal). In addition to up-conversion of the IF signal, the frequency mixing unit 20 transmits the generated LO signal to the down conversion mixer 17. A detailed configuration of the frequency mixing unit 20 will be described later.

The transmission antenna 15 transmits, as a radio wave, the $RF_{TX}$ signal which is the output signal of the frequency mixing unit 20.

The receiving antenna 16 receives a reception signal (hereinafter referred to as a $RF_{RX}$ signal) which is a wireless signal, and transmits the $RF_{RX}$ signal to the down conversion mixer 17.

Based on the LO signal received from the frequency mixing unit 20 and the $RF_{RX}$ signal received from the receiving antenna 16, the down conversion mixer 17 down-converts the $RF_{RX}$ signal to output a baseband signal including reception information.

Figure 2:
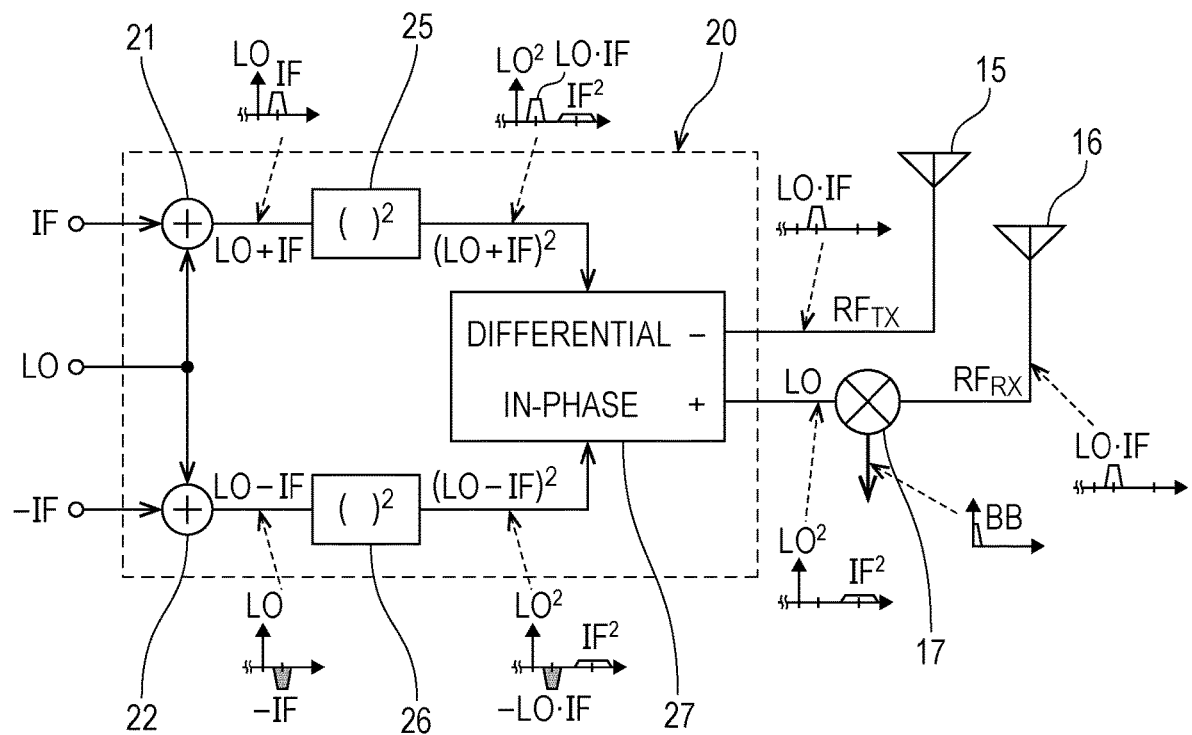
FIG. 2 is a block diagram showing a configuration of a frequency mixing unit according to the embodiment.

Subsequently, the configuration of the frequency mixing unit 20 according to the present embodiment will be described with reference to a block diagram of FIG. 2. As shown in FIG. 2, the frequency mixing unit 20 includes a first adding unit 21, a second adding unit 22, a first multiplication unit 25, a second multiplication unit 26, and an adding/subtraction unit 27.

As a first adding step, the IF signal generated by the modulation unit 14 and the LO signal generated by the second local oscillator 13 are input to the first adding unit 21, and the first adding unit 21 outputs a signal obtained by adding-up of the IF signal and the LO signal.

As a second step, the second adding unit 22 outputs a signal obtained in such a manner that an inverted-phase signal (hereinafter referred to as a –IF signal) obtained by inversion of the phase of the IF signal generated by the modulation unit 14 by a not-shown phase inversion circuit and the LO signal generated by the second local oscillator 13 are added up.

As a first multiplication step, the first multiplication unit 25 up-converts the IF signal to generate a high-frequency transmission signal. Specifically, the first multiplication unit 25 multiplies the output signal of the first adding unit 21 including the IF signal, thereby outputting the resultant signal. In the present embodiment, the first multiplication unit 25 includes a double multiplier configured to double the input signal by means of a square mixer as a multiplier, and doubles the signal input from the first adding unit 21 to output the resultant signal.

As a second multiplication step, the second multiplication unit 26 up-converts the input signal to generate a high-frequency transmission signal. Specifically, the second multiplication unit 26 multiplies the output signal of the second adding unit 22 including the –IF signal, thereby outputting the resultant signal. In the present embodiment, the second multiplication unit 26 includes a double multiplier configured to double the input signal by means of a square mixer as a multiplier, and doubles the signal input from the second adding unit 22 to output the resultant signal.

The adding/subtraction unit 27 includes a subtractor configured to subtract the output signal of the second multiplication unit 26 from the output signal of the first multiplication unit 25. As an addition/subtraction step, the adding/subtraction unit 27 outputs, as the $RF_{TX}$ signal, a subtraction signal generated by the subtractor to the transmission antenna 15. Moreover, the adding/subtraction unit 27 includes an adder configured to add up the output signal of the first multiplication unit 25 and the output signal of the second multiplication unit 26, and outputs, to the down conversion mixer 17, an addition signal generated by addition as the addition/subtraction step and including the LO signal.

More specifically, the method for generating the baseband signal including the reception information according to the present invention will be described with reference to the power spectrum of the signal at each point shown in FIG. 2. First, the first adding unit 21 inputs the signal (a (LO+IF) signal) obtained by adding-up of the IF signal and the LO signal to the first multiplication unit 25.

The first multiplication unit 25 multiplies the (LO+IF) signal. The (LO+IF) signal is multiplied by a frequency mixer, i.e., the multiplier. The first multiplication unit 25 of the present embodiment doubles the output signal of the first adding unit 21. Thus, the first multiplication unit 25 performs arithmetic processing represented by Expression (1) below:

$$(LO+IF)^2 = LO^2 + 2LO \cdot IF + IF^2 \quad (1)$$

where LO indicates the LO signal and IF indicates the IF signal.

The second adding unit 22 inputs the signal (a (LO–IF) signal) obtained by adding-up of the –IF signal and the LO signal to the second multiplication unit 26. As in the above-described first multiplication unit 25, the second multiplication unit 26 doubles the (LO −IF) signal to output a signal represented by Expression (2) below:

$$(LO-IF)^2 = LO^2 - 2LO \cdot IF + IF^2 \quad (2)$$

where LO indicates the LO signal and IF indicates the IF signal.

The adding/subtraction unit 27 outputs a differential signal obtained by subtraction of the output signal of the second multiplication unit 26 from the output signal of the first multiplication unit 25. As shown in Expressions (1) and (2) above and the output power spectra conceptually represented by the block diagram of FIG. 2, signals corresponding to $LO^2$ and $IF^2$ of the output signal of the first multiplication unit 25 are equal to signals corresponding to $LO^2$ and $IF^2$ of the output signal of the second multiplication unit 26. Thus, the subtraction signal obtained by subtraction of the output signal of the second multiplication unit 26 from the output signal of the first multiplication unit 25 is a signal that LO·IF remains and $LO^2$ and $IF^2$ which are unnecessary waves for the transmission signal $RF_{TX}$ are removed.

The adding/subtraction unit 27 outputs an in-phase signal obtained by adding-up of the output signal of the first multiplication unit 25 and the output signal of the second multiplication unit 26. As shown in Expressions (1) and (2) above and the output power spectra of FIG. 2, a signal corresponding to +2LO·IF of the output signal of the first multiplication unit 25 is equal to an inverted-phase signal of a signal corresponding to −2LO·IF of the output signal of the second multiplication unit 26. Thus, the addition signal obtained by adding-up of the output signal of the first multiplication unit 25 and the output signal of the second multiplication unit 26 is a signal that $LO^2$ and $IF^2$ remain and LO·IF is removed.

The adding/subtraction unit 27 outputs, to the down conversion mixer 17, the $LO^2$ signal generated as the above-described addition signal. In a case where the transmitter/receiver 1 performs half-duplex communication, there is no input of the IF signal to the frequency mixing unit 20 upon reception of the $RF_{RX}$ signal, and therefore, the output signal from the adding/subtraction unit 27 to the down conversion mixer 17 is only the $LO^2$ signal.

In a case where the transmitter/receiver 1 performs full duplex communication, the signal corresponding to $IF^2$ of the addition signal may be ignored because such a signal is a signal with a low power level, or may be removed by a frequency filter, which allows passage of a signal with a predetermined frequency, while passage of the $LO^2$ signal is allowed. As a down-conversion step, the down conversion mixer 17 down-converts the reception signal $RF_{RX}$ based on the reception signal $RF_{RX}$ received by the receiving antenna 16 and having the same band as that of the transmission signal $RF_{TX}$ and the LO signal received from the adding/subtraction unit 27, thereby generating and outputting the baseband signal including the reception information.

The frequency mixing unit 20 is configured as described above. The frequency mixing unit 20 outputs, as the transmission signal $RF_{TX}$, the high-frequency signal LO·IF obtained by removal of the unnecessary signals from the IF signal and the LO signal, and outputs the LO signal for down-converting the reception signal $RF_{RX}$.

Figure 3:
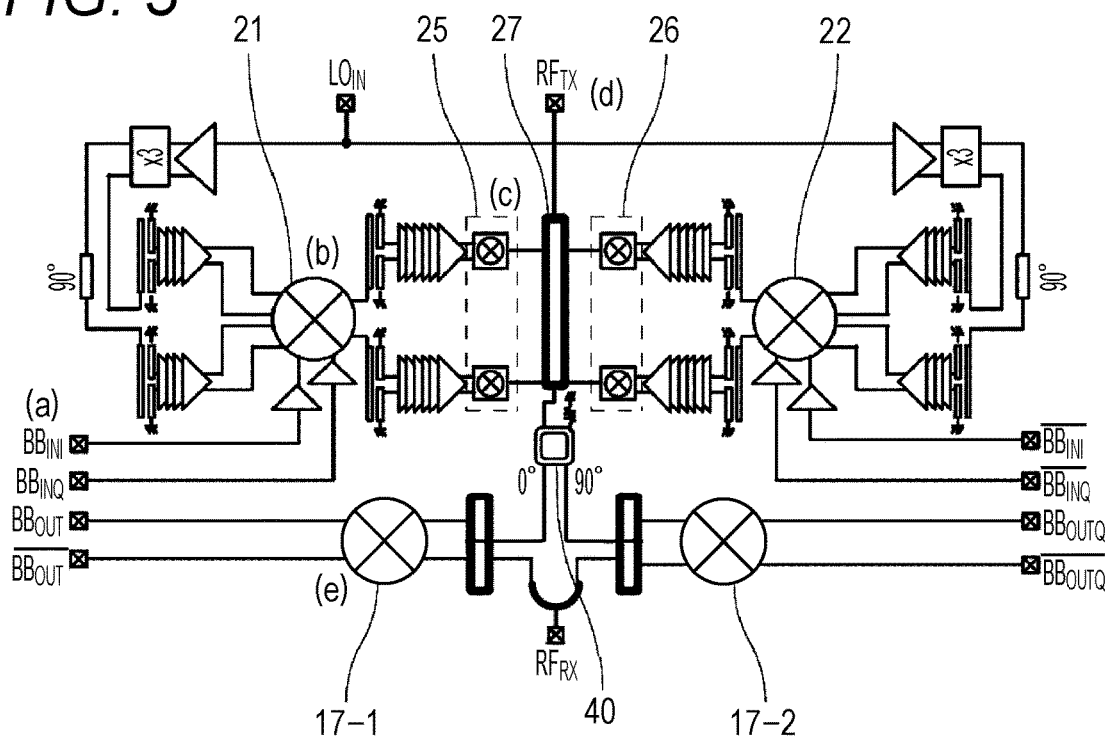
FIG. 3 is a diagram showing an example of a circuit configuration of the transmitter/receiver according to the embodiment.

FIG. 3 shows an example of a circuit configuration of the transmitter/receiver 1 according to the present embodiment. In a circuit shown on the left side of FIG. 3, the LO signal obtained by cubing the input local oscillation signal and the input baseband signal are input to the first adding unit 21 as a quadrature up-conversion mixer, and the (LO+IF) signal for an I-channel and a Q-channel is generated.

The first multiplication unit 25 as the square mixer multiplies the (LO+IF) signal input from the first adding unit 21, and outputs the $(LO+IF)^2$ signal.

In a circuit on the right side of FIG. 3, the LO signal obtained by tripling of the input local oscillation signal and the input inverted-phase baseband signal are input to the second adding unit 22 as a quadrature up-conversion mixer, and the (LO−IF) signal for the I-channel and the Q-channel is generated.

The second multiplication unit 26 as the square mixer multiplies the (LO−IF) signal input from the second adding unit 22, and outputs the $(LO-IF)^2$ signal.

The output signals from the first multiplication unit 25 and the second multiplication unit 26 are input to the adding/subtraction unit 27 as a rat-race power combiner. The adding/subtraction unit 27 outputs the LO·IF signal as the transmission signal $RF_{TX}$, and outputs the LO signal to a branch-line hybrid 40.

The LO signal distributed by the branch-line hybrid 40 is, together with the reception signal $RF_{RX}$ received by the receiving antenna 16, input to down conversion mixers 17-1, 17-2. The down conversion mixers 17-1, 17-2 down-convert the reception signal $RF_{RX}$ to generate and output the baseband signals for the I-channel and the Q-channel.

Figure 4:
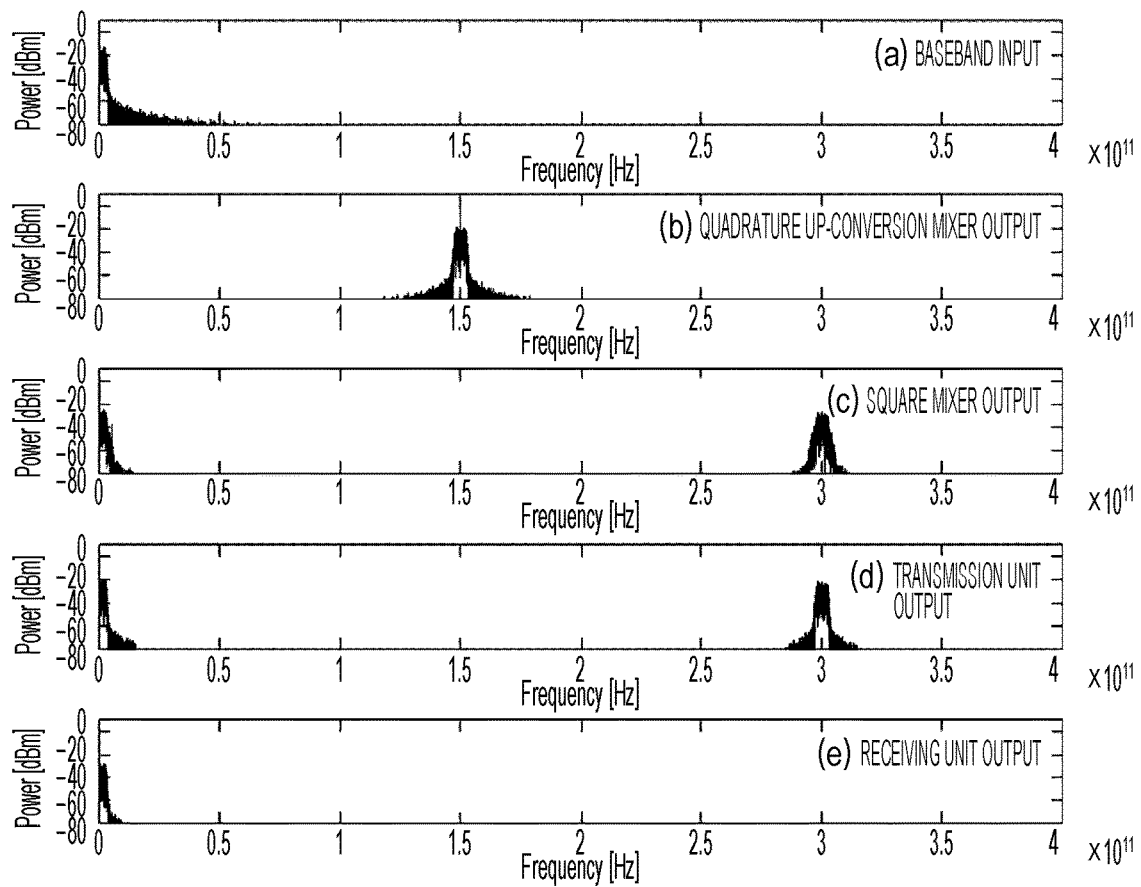
FIG. 4 is graphs showing an example of signal power spectra at points (a) to (e) of the circuit of FIG. 3.

FIG. 4 is a graph showing an example of simulation results in a case where the transmitter/receiver 1 shown in FIG. 3 is configured as a CMOS circuit and a transmission signal with a frequency around 300 GHz is generated. A modulation method in this example is 64 quadrature amplitude modulation (QAM), a symbol rate is 5 Gbaud, the input local oscillation signal is 50 GHz, the center frequency of the IF signal is 150 GHz, and the center frequency of the $RF_{TX}$ signal is 300 GHz. In this simulation, the $RF_{TX}$ signal as the output signal of the transmitter/receiver 1 is, as the $RF_{RX}$ signal, input back to the transmitter/receiver 1.

Figure 5:
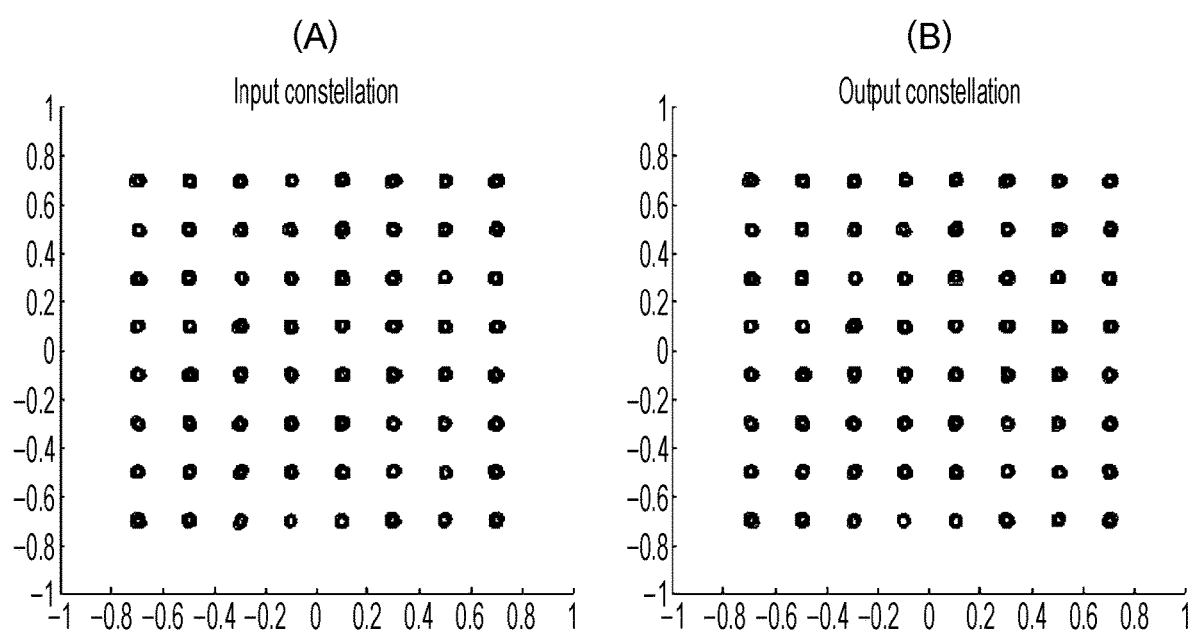
FIG. 5(A) is a graph showing an example of a constellation of an input signal of the transmitter/receiver according to the embodiment.
FIG. 5(B) is a graph showing an example of a constellation of an output signal of the transmitter/receiver according to the embodiment.

FIGS. 5(A) and 5(B) are graphs showing a transmission/reception signal constellation according to the simulation of FIG. 4. The receiving unit output constellation of FIG. 5(B) shows that the reception signal $RF_{RX}$ can be accurately modulated.

As described above, the frequency mixing unit 20 of the transmitter/receiver 1 according to the present embodiment utilizes the LO signal generated upon generation of the $RF_{TX}$ signal which is the transmission signal as the LO signal of the down conversion mixer 17 of the receiving unit, and down-converts the $RF_{RX}$ signal as the reception signal. With this configuration, an LO signal generation unit of the receiving unit can be omitted, and therefore, the power consumption of the transmitter/receiver 1 can be reduced and a circuit area can be decreased.

Various embodiments and modifications can be made to the present invention without departing from the broad spirit and scope of the present invention. The above-described embodiment has been described for describing the present invention, and is not intended to limit the scope of the present invention. That is, the scope of the present invention is not defined by the embodiment, but is defined by the claims. Various modifications made within the scope of the claims and an equivalent scope thereof are considered as being within the scope of the present invention.

INDUSTRIAL APPLICABILITY

The present invention is suitable for a transmitter/receiver configured to perform wireless communication by means of a high-frequency signal. Specifically, the present invention is suitable for a transmitter/receiver configured to perform wireless communication by means of a higher-frequency carrier wave than the maximum operating frequency of a transistor used for, e.g., a signal amplification circuit of the transmitter/receiver.

LIST OF THE REFERENCE NUMERALS

1 Transmitter/Receiver
11 Baseband Unit
12 First Local Oscillator
13 Second Local Oscillator
14 Modulation Unit
15 Transmission Antenna
16 Receiving Antenna
17, 17-1, 17-2 Down Conversion Mixer
20 Frequency Mixing Unit
21 First Adding Unit
22 Second Adding Unit
25 First Multiplication Unit
26 Second Multiplication Unit
27 Adding/Subtraction Unit
40 Branch-Line Hybrid

The invention claimed is:

1. A transmitter/receiver comprising:
a local oscillator configured to up-convert an input signal having a predetermined frequency band to output a local oscillation signal for generating a transmission signal;
a first adding unit configured to output a signal obtained by adding up of the input signal and the local oscillation signal;
a first multiplication unit configured to multiply the output signal of the first adding unit;
a second adding unit configured to output a signal obtained by adding up of an inverted-phase signal of the input signal and the local oscillation signal;
a second multiplication unit configured to multiply the output signal of the second adding unit;
an adding/subtraction unit configured to output an addition signal and a subtraction signal generated by adding-up and subtraction of the signal multiplied by the first multiplication unit and the signal multiplied by the second multiplication unit; and
a down conversion mixer configured to down-convert a reception signal received by a receiving antenna by means of the addition signal generated by the adding/subtraction unit.

2. The transmitter/receiver according to claim 1, wherein each of the first multiplication unit and the second multiplication unit includes
a double multiplier configured to double a signal input thereto.

3. The transmitter/receiver according to claim 1, wherein the input signal is
an intermediate frequency signal obtained by mixing of a baseband signal and the local oscillation signal.

4. The transmitter/receiver according to claim 1, further comprising:
a frequency filter configured to allow passage of a signal with a predetermined frequency in the addition signal,
wherein full duplex communication is performed.

5. A signal generation method comprising:
a first adding step of adding a local oscillation signal to an input signal having a predetermined frequency band;
a first multiplication step of multiplying the signal obtained by addition at the first adding step;
a second adding step of adding the local oscillation signal to an inverted-phase signal of the input signal;
a second multiplication step of multiplying the signal obtained by addition at the second adding step;
an addition/subtraction step of subtracting the signal multiplied at the second multiplication step from the signal multiplied at the first multiplication step to generate a subtraction signal and adding up the signal multiplied at the first multiplication step and the signal multiplied at the second multiplication step to generate an addition signal; and
a down conversion step of down-converting a reception signal received by a receiving antenna by means of the addition signal.

* * * * *